(12) United States Patent
Cho

(10) Patent No.: US 6,736,987 B1
(45) Date of Patent: May 18, 2004

(54) SILICON ETCHING APPARATUS USING XEF$_2$

(75) Inventor: Dong-Il Cho, Seoul (KR)

(73) Assignee: Techbank Corporation, Seoul (KR)

( * ) Notice: Subject to any disclaimer, the term of this patent is extended or adjusted under 35 U.S.C. 154(b) by 0 days.

(21) Appl. No.: 09/614,785

(22) Filed: Jul. 12, 2000

(51) Int. Cl.$^7$ .................. C23F 1/00; H01L 21/00; H01H 1/00
(52) U.S. Cl. ................. 216/58; 216/59; 438/706; 156/345.1
(58) Field of Search .............. 156/345.1, 345.26, 156/345.29; 118/715; 438/706, 710, 719, 711, 712, 714; 216/59, 58, 67, 69

(56) References Cited

U.S. PATENT DOCUMENTS

| | | | |
|---|---|---|---|
| 4,190,488 A | * 2/1980 | Winters | 216/75 |
| 4,478,677 A | * 10/1984 | Chen et al. | 216/65 |
| 4,889,609 A | * 12/1989 | Cannella | 204/298.35 |
| 5,716,494 A | * 2/1998 | Imai et al. | 438/700 |
| 6,123,765 A | * 9/2000 | Sinha et al. | 117/84 |
| 6,290,864 B1 | * 9/2001 | Patel et al. | 216/79 |
| 6,409,876 B1 | * 6/2002 | McQuarrie et al. | 156/345 |

FOREIGN PATENT DOCUMENTS

| | | | | |
|---|---|---|---|---|
| JP | 61-134019 A | * | 6/1986 | H01L/21/30 |
| JP | 61-181131 A | * | 8/1986 | H01L/21/302 |
| JP | 10-209088 A | * | 8/1998 | H01L/21/302 |
| JP | 10-317169 A | * | 12/1998 | C23F/1/12 |

* cited by examiner

*Primary Examiner*—Parviz Hassanzadeh
(74) *Attorney, Agent, or Firm*—Head, Johnson & Kachigian

(57) ABSTRACT

The silicon etching apparatus using XeF$_2$ includes: a basic structure composed of a loading chamber tot loading XeF$_2$, an expansion chamber for collecting sublimated XeF$_2$ gas, and an etching chamber for performing an etching process; and a means for injecting nitrogen prior to the etching process to eliminate air moisture in the apparatus and thus preventing the formation of HF. The silicon etching apparatus using XeF$_2$ further includes: an injector having a predefined shape provided in the etching chamber for uniformly injecting the XeF$_2$ gas downward on to surface of a wafer; a feedback controller for feedback controlling the internal pressure of the loading chamber in order to prevent sublimation of the residual XeF$_2$ in the loading chamber; and a weight scale for measuring the weight of XeF$_2$ in the loading chamber.

5 Claims, 5 Drawing Sheets

BOTTOM VIEW

SIDE VIEW

PERSPECTIVE VIEW

XeF₂ INJECTOR DURING THE ETCHING STEP

BOTTOM VIEW

SIDE VIEW

PERSPECTIVE VIEW

XeF2 INJECTOR DURING THE ETCHING STEP

SILICON ETCHING APPARATUS USING XEF$_2$

TECHNICAL FIELD

The present invention generally relates to a silicon etching apparatus and, more particularly, to a silicon etching apparatus using XeF$_2$.

BACKGROUND ART

There are a variety of etching reagents used for silicon bulk etching to accurate dimensions, ranging from a liquid type etchant such as ethylene diamine pyrocatechol (EDP) and KOH to high energy plasma Type etchants based on Cl$_2$ or SF$_6$ gases. These etching reagents may provide much flexibility and controllability in the manufacture of accurately defined microstructures but have a limitation on use due to the limited selectivity with respect to general materials such as photoresist or oxide commonly used as a masking layer in the etching process.

Xenon difluoride (hereinafter, referred to as "XeF$_2$") is a silicon etching reagent in a dry gas phase which presents several advantages over the above silicon etching reagents. XeF$_2$ is a white solid at the room temperature under the atmospheric pressure and sublimates at the room temperature (25° C.) under a pressure less than 3.8 Torr. An etching method using sublimated XeF$_2$ has a high selectivity to photoresist, oxide or aluminum layers and enables etching silicon in the gas phase, thus preventing the resulting structure adhering to the substrate. Also, such an etching method enables rapid etching of the bottom surface of a large-sized silicon structure due to an isotropic etching characteristic and a high etching rate of several µm/min. This etching method using XeF$_2$ alone neither forms a polymer layer nor leaves other contaminants on the etched surfaces.

A conventional silicon etching apparatus using XeF$_2$ is composed of a loading chamber for loading XeF$_2$, an expansion chamber for collecting sublimated XeF$_2$ gas, and an etching chamber for performing an etching process.

Several conventional XeF$_2$-based silicon etching apparatuses of the above structure involve some problems as follows:

First, during the silicon etching process using XeF$_2$, air moisture existing in the etching apparatus associates fluorine with hydrogen to form hydrofluoric acid(HF), which may damage a silicon oxide layer used as a profile protecting layer of the silicon. It is thus required to dehumidify the inside of the apparatus completely prior to the XeF$_2$-based silicon etching process.

Second, the XeF$_2$-based etching may not be performed uniformly even on a full silicon wafer, because the etching occurs further in a portion having a denser XeF$_2$ gas on the surface of the silicon wafer than a portion with less dense XeF$_2$ gas. So, the etching uniformity depends on how the XeF$_2$ gas is uniformly distributed all over the surface of the target wafer.

Third, sublimation of the residual XeF$_2$ in the loading chamber may be problematic. It is general that the remaining XeF$_2$ after the etching process is reserved in the loading chamber for future uses, with the loading chamber maintained under vacuum according to the vacuum-based maintenance and control method. However, XeF$_2$ continuously sublimates in the loading chamber at the room temperature under a pressure less than 3.8 Torr. Such a sublimation of XeF$_2$ causes unnecessary consumption of an expensive material and association of the sublimated XeF$_2$ gas with air moisture to corrode the chamber and other connected, annexed parts.

Finally, it is hard to measure the amount of the residual XeF$_2$ in the loading chamber. The conventional XeF$_2$-based silicon etching apparatus has a window on the loading chamber for visual checking the amount of the residual XeF$_2$ in the chamber after the completion of the etching process. Such a visual check is a troublesome method and sometimes impossible when HF is formed from the sublimated XeF$_2$ associating with air moisture to corrode the window of the loading chamber cloudy.

DISCLOSURE OF INVENTION

The present invention is to solve the problems with the conventional XeF$_2$-based silicon etching apparatus and it is therefore an object of the present invention to provide a XeF$_2$-based silicon etching apparatus capable of eliminating the internal air moisture to minimize damages on a silicon oxide layer.

It is another object of the present invention to provide a XeF$_2$-based silicon etching apparatus enabling uniform etching of a full silicon wafer.

If is further another object of the present invention to provide a XeF$_2$-based silicon etching apparatus capable of preventing sublimation of the residual XeF$_2$ in a loading chamber.

It is still another object of the present invention to provide a XeF$_2$-based silicon etching apparatus capable of measuring the amount of the residual XeF$_2$ in the loading chamber.

To achieve the above objects, there is provided a silicon etching apparatus using XeF$_2$ including: a basic structure composed of a loading chamber for loading XeF$_2$, an expansion chamber for collecting sublimated XeF$_2$ gas, and an etching chamber for performing an etching process; and a means for injecting nitrogen prior to the etching process to eliminate air moisture in the apparatus and thus preventing the formation of HF.

The silicon etching apparatus using XeF$_2$ further includes an injector having a predefined shape provided in the etching chamber for uniformly injecting the XeF$_2$ gas on the surface of a wafer.

The silicon etching apparatus using XeF$_2$ further includes a feedback controller for feedback controlling the internal pressure of the loading chamber in order to prevent sublimation of the residual XeF$_2$ in the loading chamber.

The silicon etching apparatus using XeF$_2$ further includes a weight scale for measuring the weight of remaining XeF$_2$ in the loading chamber.

PREFERRED EMBODIMENT FOR CARRYING OUT THE INVENTION

Reference will now be made in detail to a XeF$_2$-based silicon etching apparatus according to the present invention, examples of which are illustrated in the accompanying drawings.

Figure 1:
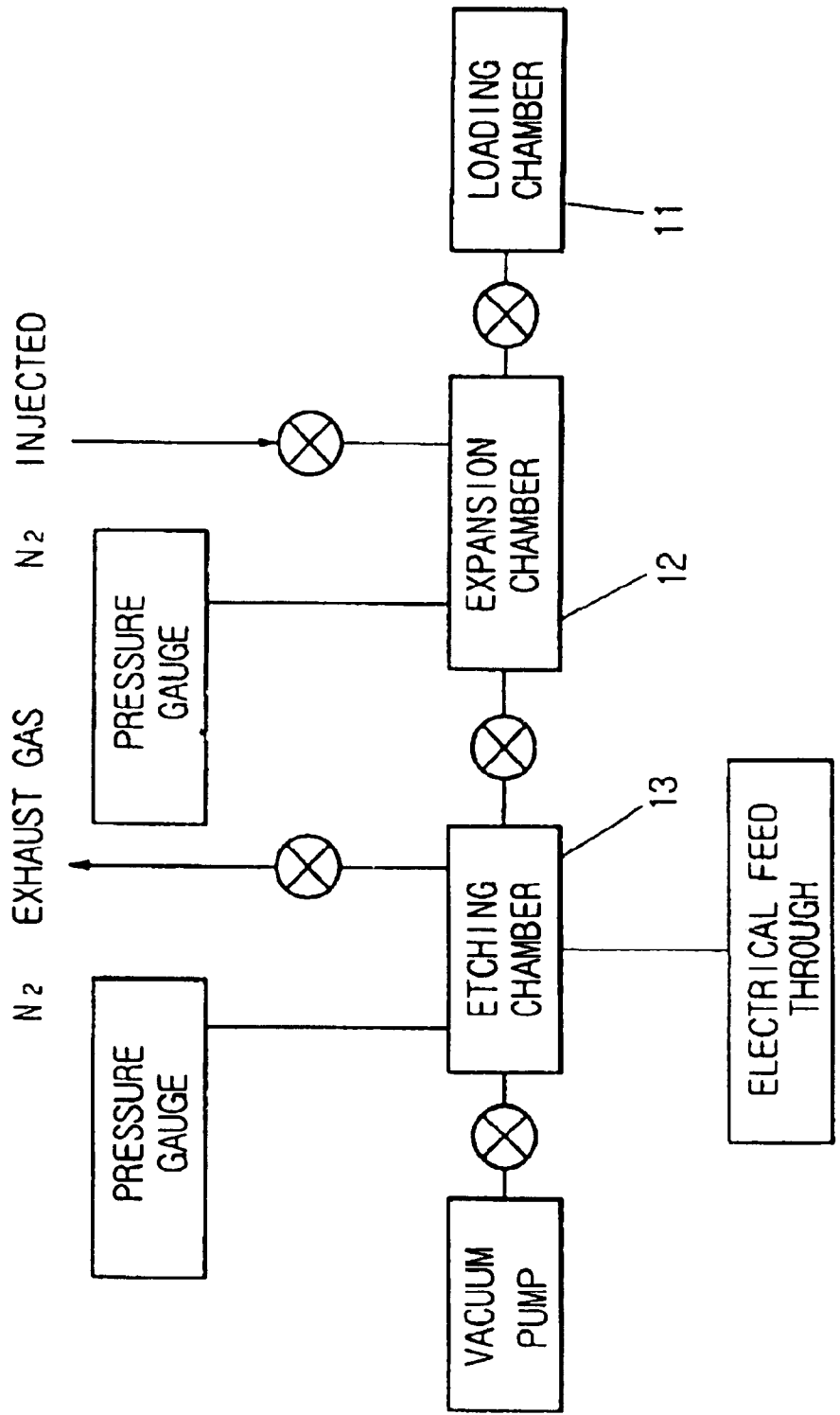
FIG. 1 is a schematic diagram of a XeF$_2$-based silicon etching apparatus according to an embodiment of the present invention.
Figure 2A:
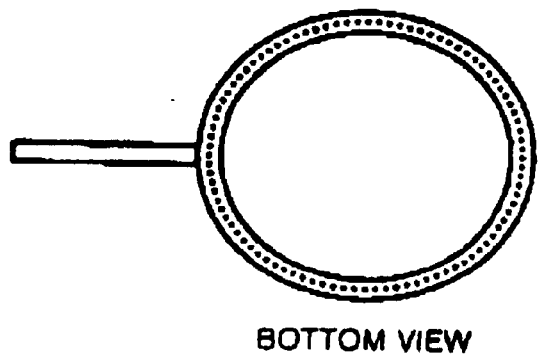
FIGS. 2a–2d show examples of a XeF$_2$ injector in an etching chamber contrive according to the present invention.
Figure 2B:
Figure 2C:
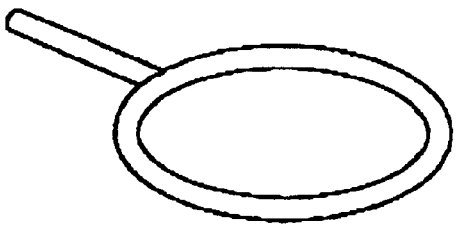
Figure 2D:
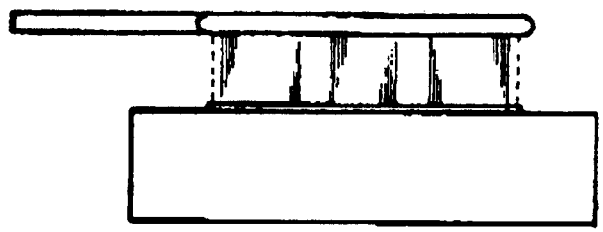
Figure 3A:
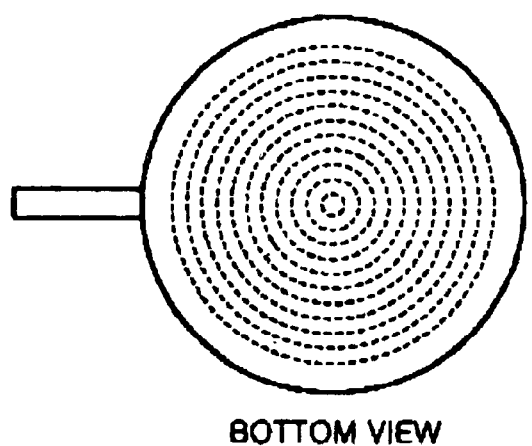
Figure 3B:
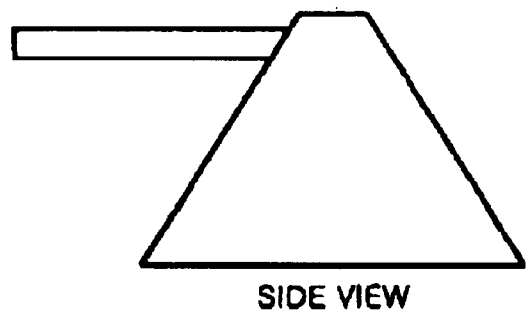
Figure 3C:
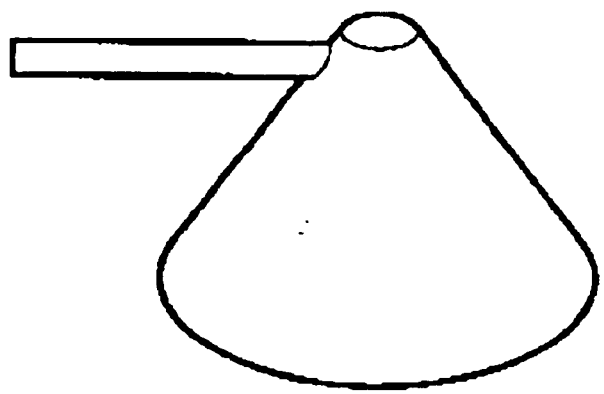
Figure 3D:
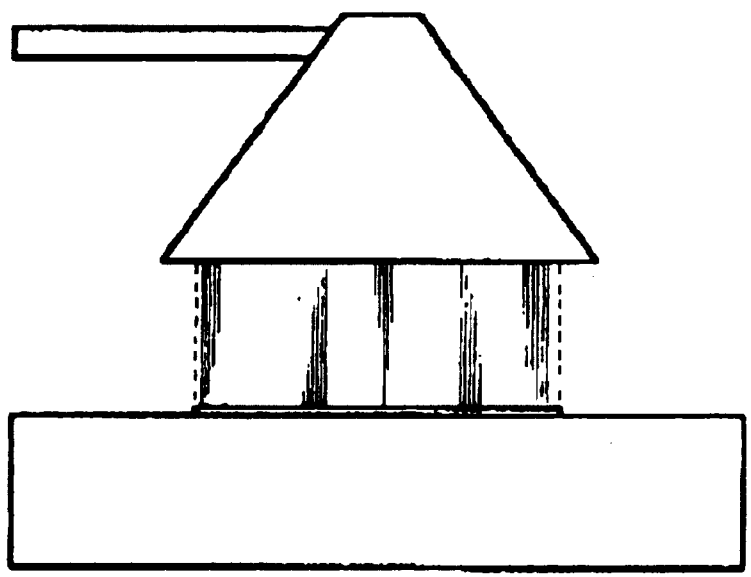

FIG. 1 is a schematic diagram of a XeF$_2$-based silicon etching apparatus according to an embodiment of the present invention.

As shown in FIG. 1, the XeF$_2$-based silicon etching apparatus of the present invention comprises a loading chamber 11, an expansion chamber 12, an etching chamber 13 and, further, a nitrogen injector for purging with nitrogen prior to the etching process to eliminate air moisture existing in the apparatus and thus, to prevent the formation of HF. Removal of HF raises the selectivity of silicon to masking oxide layers to more than 2000:1 to reduce damage to the masking oxide layers profile, enabling a long etching process.

The XeF$_2$-based silicon etching apparatus of the present invention further comprises a XeF$_2$ injector having a predefined shape provided in the etching chamber 13 in order to provide uniformity in etching a full silicon wafer.

FIGS. 2 and 3 show examples of a XeF$_2$ injector in the etching chamber contrived according to the present invention. FIGS. 2a and 3a are bottom views of the XeF injector; FIGS. 2b and 3b are side views; FIGS. 2c and 3c are perspective views; and FIGS. 2d and 3d show the XeF$_2$ injector during the etching step. As shown in FIGS. 2 and 3, the XeF$_2$ injector of the present invention is contrived to uniformly inject XeF$_2$ from the top to the bottom in the etching chamber 13, thus creating a uniform downward viscous laminar motion of the XeF$_2$ gas. This is because the XeF$_2$ whose molecular weight is 169.29 g/mol is heavier than air (dry air, 28.96 g/mol) or nitrogen (28.0134 g/mol), and because in this low pressure environment the downward flow becomes highly viscous.

The XeF$_2$-based silicon etching apparatus of the present invention further comprises a means for maintaining the pressure of the loading chamber above 3.8 Torr and lower than the atmospheric pressure in order to prevent sublimation of the residual XeF$_2$ in the loading chamber which the etching apparatus is not use. With the internal pressure of the loading chamber lower than the atmospheric pressure. The cover of the loading chamber is maintained closed. In order to open the cover, the internal pressure of the loading chamber is increased to a pressure higher than the atmosphere pressure.

Figure 4:
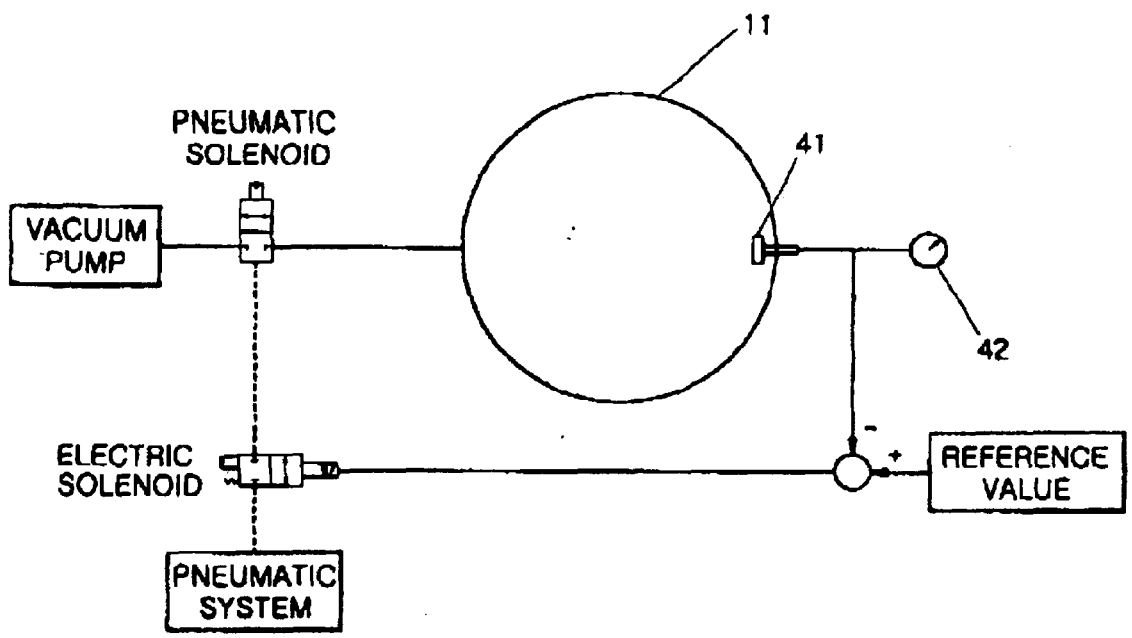
FIG. 4 is a schematic diagram of a feedback controller for maintaining the pressure of a loading chamber in the XeF$_2$ based silicon etching apparatus of the present invention.

FIG. 4 is a schematic diagram of a feedback controller for maintaining the pressure of the loading chamber 11 in the XeF$_2$-based silicon etching apparatus of the present invention, As shown in FIG. 4, the feedback controller maintains, by way of feedback control, the internal pressure of the loading chamber 11 to a constant pressure between 3.8 Torr, which is the sublimation pressure of XeF$_2$, and the atmospheric pressure. For this, the apparatus further comprises a pressure sensor 41 in the loading chamber 11 and uses a pressure gauge 42 to measure the internal pressure of the loading chamber 11, subtracting the measured pressure value from a reference pressure between the sublimation pressure of XeF$_2$ and the atmospheric pressure for feedback.

The XeF$_2$-based silicon etching apparatus of the present invention further comprises a weight scale provided in the loading chamber 11 in order to measure the amount of the residual XeF$_2$ in the loading chamber 11.

Figure 5:
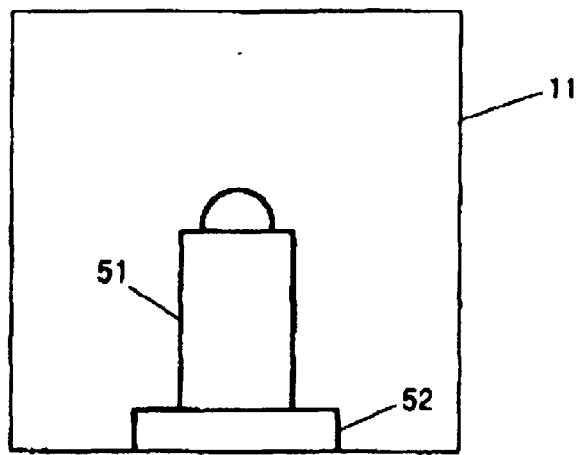
FIG. 5 is a diagram of a weight scale in use, provided in the loading chamber of the XeF$_2$-based silicon etching apparatus according to the present invention.

FIG. 5 is a diagram showing the weight scale in use, provided in the loading chamber of the XeF$_2$-based silicon etching apparatus according to the present invention. A container 51 filled with XeF$_2$ is placed on the weight scale 52 in the loading chamber 11 and the chamber 11 is made airtight. With the container 51 open, the weight of XeF$_2$ plus the container is measured, while measuring the weight of the residual XeF$_2$ in the loading chamber at any time during the etching step, to estimate the remaining time for performing the etching step with the residual XeF$_2$.

As described in the above, the XeF$_2$-based silicon etching apparatus of the present invention eliminates the inner air moisture to minimize a damage to an oxide layer and further comprises (a) the XeF$_2$ injector having a predefined shape in the etching chamber to enable uniform etching of a full silicon wafer, (b) the feedback controller for feedback controlling the pressure of the loading chamber above the sublimation pressure of XeF$_2$ and below the atmospheric pressure to prevent sublimation of the residual XeF$_2$ in the loading chamber, and (c) the weight scale provided in the loading chamber to measure the amount of the residual XeF$_2$.

What is claimed is:

1. A method for etching a silicon wafer using XeF$_2$ not disassociated by plasma generating means, comprising steps of:

(a) etching a silicon wafer using an etching apparatus comprising a loading chamber for loading XeF$_2$, an expansion chamber for collecting sublimated XeF$_2$ from the said loading chamber, and an etching chamber for etching using XeF$_2$ not disassociated by plasma generating means supplied from the said expansion chamber;

(b) eliminating air moisture in each chamber to prevent formation of HF by injecting nitrogen to the loading chamber, the expansion chamber and the etching chamber, and exhausting the injected nitrogen therefrom prior to the said step (a); and (c) controlling the internal pressure of the loading chamber at a level between sublimation pressure of XeF$_2$ and atmospheric pressure to prevent sublimation of the residual XeF$_2$ in the loading chamber after the said step (a).

2. The method for etching a silicon wafer using XeF$_2$ as claimed in claim 1, wherein the XeF$_2$ gas is injected on the surface of the wafer with a viscous laminar downflow using an injector having a predefined shape provided in the etching chamber for uniform etching of the wafer in step (a).

3. The method for etching a silicon wafer using XeF$_2$ as claimed in claim 1, including weighing the residual XeF$_2$ gas in the loading chamber at any time during the step (a) to estimate the remaining time for performing the etching step with the residual XeF$_2$.

4. A method for etching a silicon wafer using XeF$_2$ not disassociated by plasma generating means, which method comprises:

(a) eliminating air moisture in a loading chamber, an expansion chamber, and an etching chamber to prevent formation of HF by injecting nitrogen to the loading chamber, the expansion chamber and the etching chamber and exhausting the injected nitrogen therefrom;

(b) thereafter loading XeF$_2$ not disassociated by plasma generating means in said loading chamber;

(c) collecting sublimated XeF$_2$ from said loading chamber in said expansion chamber;

(d) etching said silicon wafer in an etching chamber using XeF$_2$ supplied from said expansion chamber; and (e) controlling internal pressure of the loading chamber at a level between sublimation pressure of XeF$_2$ and atmospheric pressure to prevent sublimination of residual XeF$_2$ in the loading chamber.

5. A method for etching as set forth in claim 4 including injecting said XeF$_2$ gas on a surface of said silicon wafer with a viscous laminar downflow.

* * * * *